United States Patent
Hou (10) Patent No.: US 11,561,590 B2
(45) Date of Patent: Jan. 24, 2023

(54) TEMPERATURE CONTROL METHOD FOR COMMUNICATION SYSTEM INVOLVING ADJUSTING TRANSMISSION RATE ACCORDING TO AVERAGE TEMPERATURE OF CHIPS

(71) Applicant: Realtek Semiconductor Corporation, Hsinchu (TW)

(72) Inventor: Kuan-Yu Hou, Hsinchu (TW)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 50 days.

(21) Appl. No.: 17/210,749

(22) Filed: Mar. 24, 2021

(65) Prior Publication Data
US 2022/0147123 A1    May 12, 2022

(30) Foreign Application Priority Data
Nov. 11, 2020   (TW) .................. 109139373

(51) Int. Cl.
*G06F 1/20* (2006.01)
*H04W 88/08* (2009.01)
*H05K 7/20* (2006.01)

(52) U.S. Cl.
CPC .............. *G06F 1/20* (2013.01); *G06F 1/206* (2013.01); *H04W 88/08* (2013.01); *H05K 7/20* (2013.01); *Y02D 10/00* (2018.01)

(58) Field of Classification Search
CPC ........................................ G06F 1/206
See application file for complete search history.

(56) References Cited

U.S. PATENT DOCUMENTS

| 6,760,311 B1* | 7/2004 | Raith ............... H04B 1/036 455/433 |
| 2014/0136827 A1* | 5/2014 | Cho ................ G01K 7/01 713/1 |
| 2018/0203632 A1* | 7/2018 | Shih ............... G06F 3/0611 |
| 2021/0318736 A1* | 10/2021 | Ashwood ......... H04B 1/036 |

FOREIGN PATENT DOCUMENTS

| CN | 106576262 A | * 4/2017 | .......... G06F 1/206 |
| CN | 108628544 A | * 10/2018 | .......... G06F 1/3225 |
| TW | 201039104 A |   11/2010 | |

* cited by examiner

*Primary Examiner* — Suresh Suryawanshi
(74) *Attorney, Agent, or Firm* — Locke Lord LLP; Tim Tingkang Xia, Esq.

(57) ABSTRACT

A temperature controlling method is provided, which is suitable for a communication system including a plurality of communication chips. The temperature controlling method includes the following operations: calculating an average temperature of each communication chip; if a first flag parameter corresponding to a first chip of the plurality of communication chips is a predetermined value, adjusting a first transmission rate of the first chip according to the average temperature of the first chip; and if the first flag parameter corresponding to the first chip is different from the predetermined value, adjusting the first transmission rate according to the average temperature of a second chip of the plurality of communication chips.

20 Claims, 5 Drawing Sheets

TEMPERATURE CONTROL METHOD FOR COMMUNICATION SYSTEM INVOLVING ADJUSTING TRANSMISSION RATE ACCORDING TO AVERAGE TEMPERATURE OF CHIPS

RELATED APPLICATIONS

This application claims priority to Taiwan Application Serial Number 109139373, filed on Nov. 11, 2020, which is herein incorporated by reference in its entirety.

BACKGROUND

Technical Field

The present disclosure relates to a temperature controlling method. More particularly, the present disclosure relates to a temperature controlling method suitable for a communication system.

Description of Related Art

With the popularization of the network, a great number of wireless access points have been installed in homes and companies. A wireless access point usually reduces its operating temperature by means of heat convection through fans and openings of the housing. However, with the increased performance of the wireless access point, a conventional hardware cooling system requires larger installation space (e.g., incorporate more fans) so that the cooling capability can be improved. As a result, this is not conducive to apply thinness design to the product. On the other hand, high room temperature can significantly affect the cooling efficiency of the hardware cooling system and provide increased risk of overheating the wireless access point.

SUMMARY

The disclosure provides a temperature controlling method suitable for a communication system including a plurality of communication chips. The temperature controlling method includes the following operations: calculating an average temperature of each communication chip; if a first flag parameter corresponding to a first chip of the plurality of communication chips is a predetermined value, adjusting a first transmission rate of the first chip according to the average temperature of the first chip; and if the first flag parameter corresponding to the first chip is different from the predetermined value, adjusting the first transmission rate according to the average temperature of a second chip of the plurality of communication chips.

The disclosure provides a communication system including a plurality of communication chips and a control circuit coupled to the plurality of communication chips. The control circuit is configured to: calculate an average temperature of each communication chip; if a first flag parameter corresponding to a first chip of the plurality of communication chips is a predetermined value, adjust a first transmission rate of the first chip according to the average temperature of the first chip; and if the first flag parameter corresponding to the first chip is different from the predetermined value, adjust the first transmission rate according to the average temperature of a second chip of the plurality of communication chips.

The disclosure provides a control circuit for being coupled with a plurality of communication chips to form a communication system. The control circuit is configured to: calculate an average temperature of each communication chip; if a first flag parameter corresponding to a first chip of the plurality of communication chips is a predetermined value, adjust a first transmission rate of the first chip according to the average temperature of the first chip; and if the first flag parameter of the first chip is different from the predetermined value, adjust the first transmission rate according to the average temperature of a second chip of the plurality of the communication chips.

It is to be understood that both the foregoing general description and the following detailed description are by examples, and are intended to provide further explanation of the disclosure as claimed.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

Figure 1:
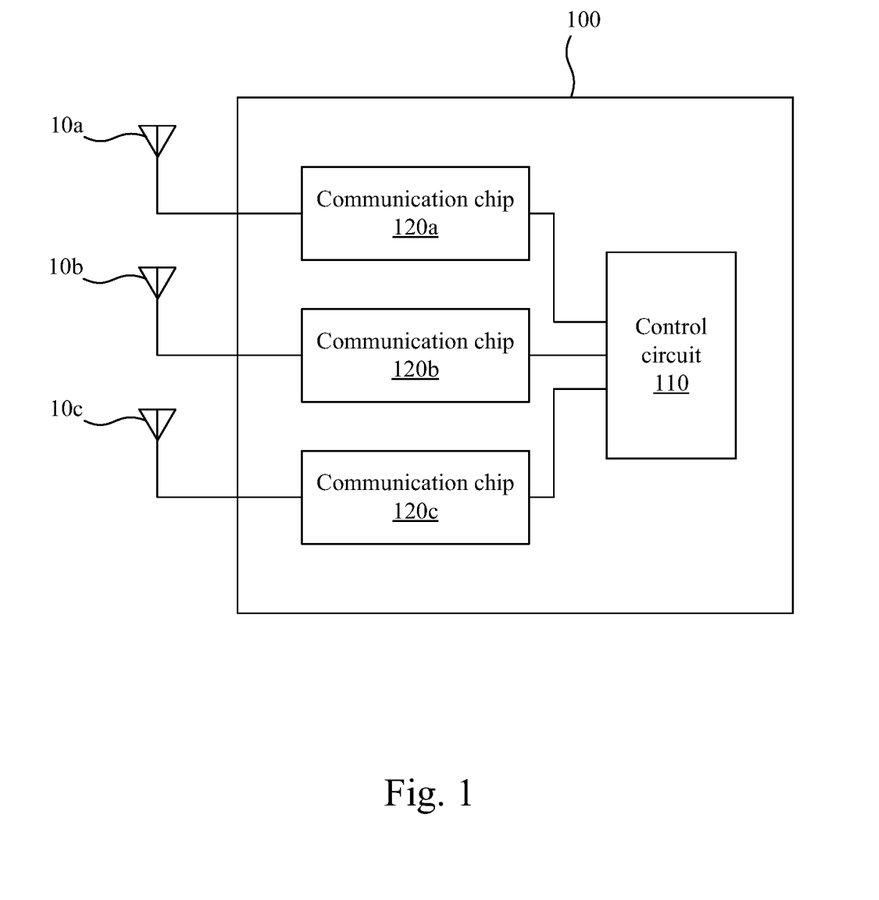
FIG. 1 is a simplified functional block diagram of a communication system 100 according to one embodiment of the present disclosure.

FIG. 1 is a simplified functional block diagram of a communication system 100 according to one embodiment of the present disclosure. The communication system 100 includes a control circuit 110 and a plurality of communication chips 120a-120c, in which the control circuit 110 is coupled with the communication chips 120a-120c. in some embodiments, the communication chips 120a-120c are configured to generate radio frequency (RF) signal, such as the Wi-Fi signal, and each communication chip may include (but not limited to) a power amplifier, a mixer, a filter, a digital-to-analog converter, etc. In alternative embodiments, the communication chips 120a-120c are coupled with antennas 10a-10c and configured to generate RF signals with identical or different frequency bands. For example, the communication chip 120a is configured to generate signals of 2.4 GHz, while the communication chips 120b-120c are configured to generate signals of 5 GHz.

The control circuit 110 is configured to calculate an average temperature of each of the communication chips 120a-120c accordingly to a predetermined time interval (e.g., once every 20 seconds). The control circuit 110 is further configured to determine data transmission rates of RF signals of the communication chips 120a-120c, according to the average temperatures of the communication chips 120a-120c, thereby preventing the communication chips 120a-120c from overheating. In some embodiments, the control circuit 110 obtains temperatures of the communication chips 120a-120c from temperature sensors (e.g., thermistors) disposed inside or around the communication chips 120a-120c. For the sake of brevity, other functional blocks of the communication system 100 are not shown in FIG. 1.

In practice, the control circuit 110 may be implemented by a central processing unit (CPU), a digital signal processor (DSP), a field programmable gate array (FPGA), or other programmable logic circuits.

In addition, the number of the communication chips 120a-120c of FIG. 1 is for exemplary purpose and not intended to limit the present disclosure. In some embodiments, the number of communication chips in the communication system 100 may be varied based on practical design requirements.

Figure 2:
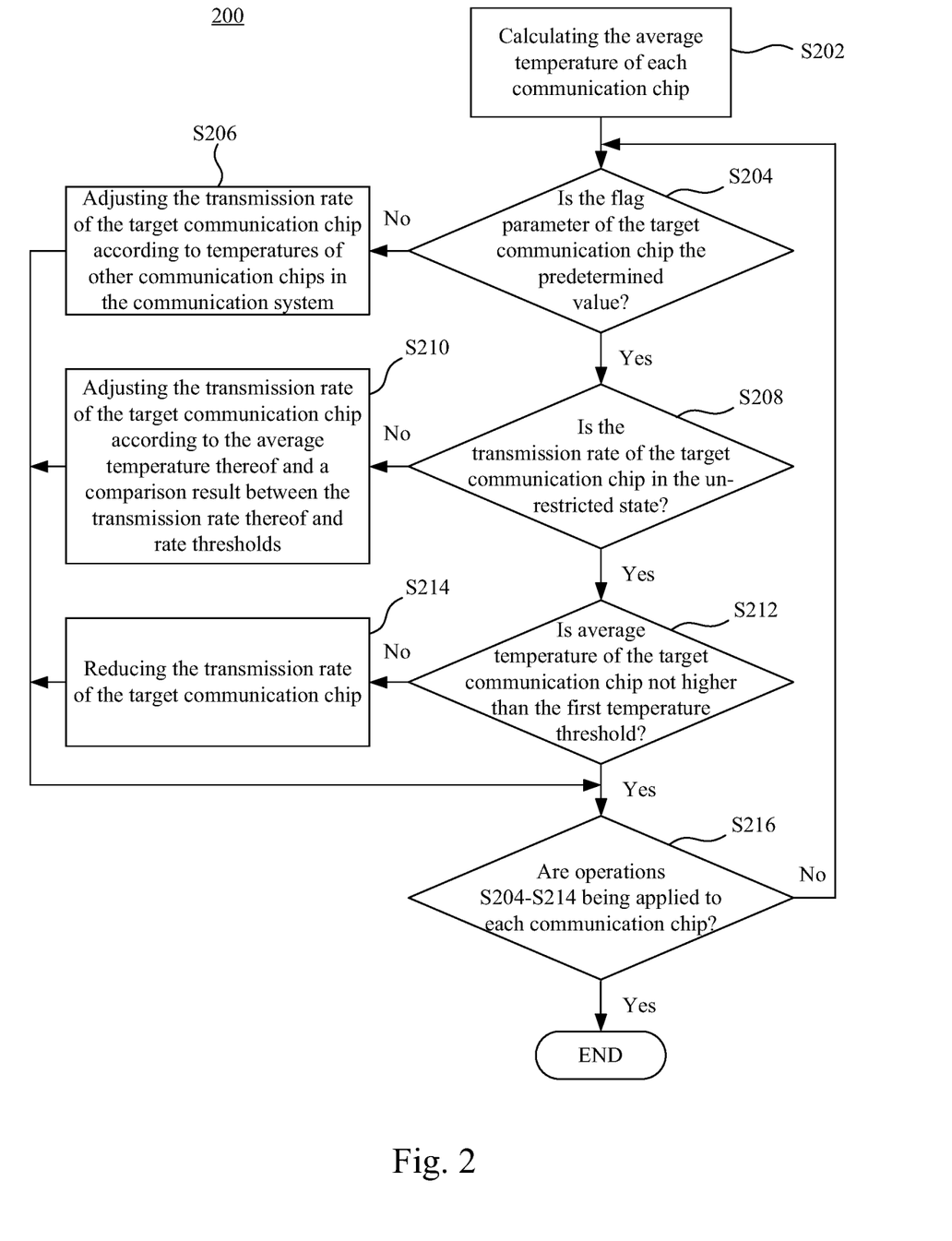
FIG. 2 is a flowchart of a temperature controlling method according to one embodiment of the present disclosure.

FIG. 2 is a flowchart of a temperature controlling method 200 according to one embodiment of the present disclosure. The control circuit 110 may determine the transmission rates of the communication chips 120a-120c by executing the temperature controlling method 200. In operation S202, the control circuit 110 calculates the average temperature within a predetermined time length (e.g., 20, 40 or 60 seconds), of each of the communication chips 120a-120c. Then, the control circuit 110 may select one of the communication chips 120a-120c as the target of the operations S204-S214. For better understanding, an embodiment that the control circuit 110 selects the communication chip 120a as the target is given.

In operation S204, the control circuit 110 determines whether a flag parameter corresponding to the communication chip 120a is (or say matches to) a predetermined value (e.g., 0). If the determination result shows NO, the control circuit 110 conducts operation S206. If the determination result shows YES, the control circuit 110 conducts operation S208. In some embodiments, a memory circuit (not shown) of the control circuit 110 stores a plurality of flag parameters corresponding to the communication chips 120a-120c, respectively, and the control circuit 110 is configured to use these flag parameters to represent temperatures of communication chips around the communication chips 120a-120c. For example, a flag parameter corresponding to the communication chip 120a is used to indicate a temperature of the nearby communication chip 120b or 120c. As another example, a flag parameter corresponding to the communication chip 120b is used to indicate a temperature of the nearby communication chip 120a or 120c, and so on.

In operation S206, the control circuit 110 adjusts the transmission rate of the communication chip 120a according to the temperature of other communication chips 120b or 120c in the communication system 100. For example, when the temperature of the communication chip 120b or 120c is excessively high, the control circuit 110 reduces (or say restrict) the transmission rate of the communication chip 120a. As another example, when the temperature of the communication chip 120b or 120c drops to a normal range, the control circuit 110 reset the transmission rate of the communication chip 120a to an un-restricted state. In some embodiments, the un-restricted state represents that the control circuit 110 applies no restrictions to the transmission rate of the communication chip 120a.

In operation S208, the control circuit 110 determines whether the transmission rate of the communication chip 120a is in the un-restricted state. If the transmission rate of the communication chip 120a is reduced (or say is in restricted state), the control circuit 110 conducts operation S210. If the transmission rate of the communication chip 120a is in the un-restricted state, the control circuit 110 conducts operation S212.

In operation S210, the control circuit 110 adjusts the transmission rate of the communication chip 120a according to the average temperature of the communication chip 120a, and also according to a comparison result between the transmission rate of the communication chip 120a and a plurality of rate thresholds. For example, when the average temperature of the communication chip 120a is lower than a first temperature threshold, the control circuit 110 may increase the transmission rate of the communication chip 120a. As another example, when the average temperature of the communication chip 120a is higher than the first temperature threshold and the transmission rate of the communication chip 120a is restricted to be lower than some transmission rate thresholds, the control circuit 110 may select appropriate cooling means corresponding to these thresholds of transmission rate, such as disabling the communication chip 120a. In some embodiments, the first temperature threshold is an upper limit of an operation temperature of each of the communication chips 120a-120c.

In operation S212, the control circuit 110 determines whether the average temperature of the communication chip 120a is lower than or equal to the first temperature threshold. If the determination result shows NO, the control circuit 110 conducts operation S214. If the determination result shows YES, the control circuit 110 conducts operation S216.

In operation S214, the control circuit 110 reduces the transmission rate of the communication chip 120a.

In some embodiments, when the control circuit 110 determines the average temperature of the communication chip 120a is higher than the first temperature threshold in operation S212, the control circuit 110 records the transmission rate of the communication chip 120a. In some embodiments, each time the control circuit 110 reduces the transmission rate, the transmission rate is reduced by a fixed ratio (e.g., 10%) of the recorded transmission rate.

In operation S216, the control circuit 110 determines whether the operations S204-S214 are applied to each one of the communication chips 120a-120c. If the determination result shows NO, the control circuit 110 may select another one of communication chips 120a-120c (e.g., the communication chip 120b) as the target and conduct operation accordingly. If the determination result shows YES, the control circuit 110 may finish execution of the method 200, or repeat the method 200 from operation S202 to monitor temperatures of the communication chips 120a-120c. In addition, when operations S206, S210 and S214 are finished, the control circuit 110 also conducts operation S216.

Figure 3:
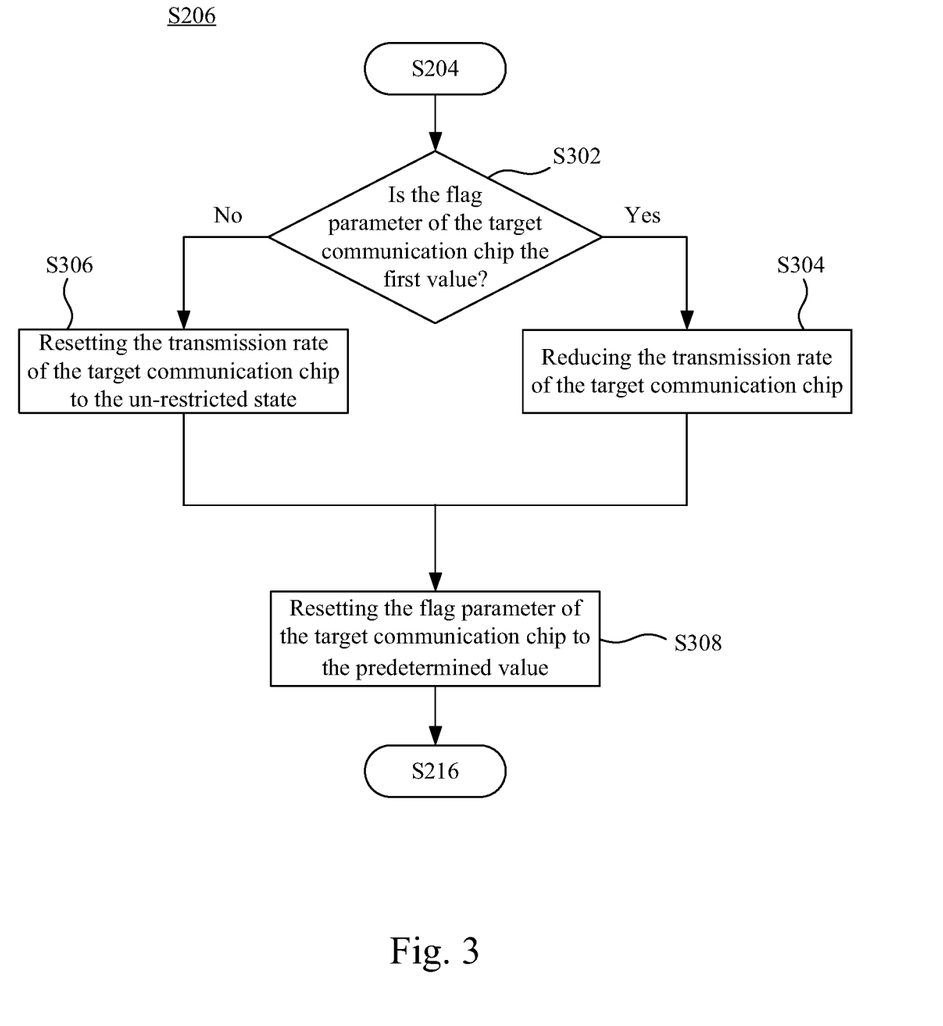
FIG. 3 is a flowchart for further illustrating operation S206 of FIG. 2.

FIG. 3 is a flowchart for further illustrating operation S206 of FIG. 2. In some embodiments, operation S206 includes operations S302-S308, in operation S302, the control circuit 110 determines whether the flag parameter corresponding to the communication chip 120a is a first value (e.g., 1), in which the first value indicates that the average temperature of the communication chip 120b or 120c around the communication chip 120a is excessively high. If the determination result shows YES, the control circuit 110 conducts operation S304 to reduce transmission rate of the communication chip 120a, so that the temperature of the communication chip 120b or 120c is reduced since the temperature of the communication chip 120a is reduced.

When the flag parameter corresponding to the communication chip 120a is not the first value but a second value (e.g., −1) indicating that the average temperature of the communication chip 120b or 120c around the communication chip 120a is normal, the control circuit 110 conducts operation S306 to reset the transmission rate of the communication chip 120a to the un-restricted state.

After the operation S304 or S306 is finished, the control circuit 110 conducts operation S308 to reset the flag parameter corresponding to the communication chip 120a to the predetermined value. The control circuit 110 may conduct operation S216 when the operation S308 is finished.

Figure 4:
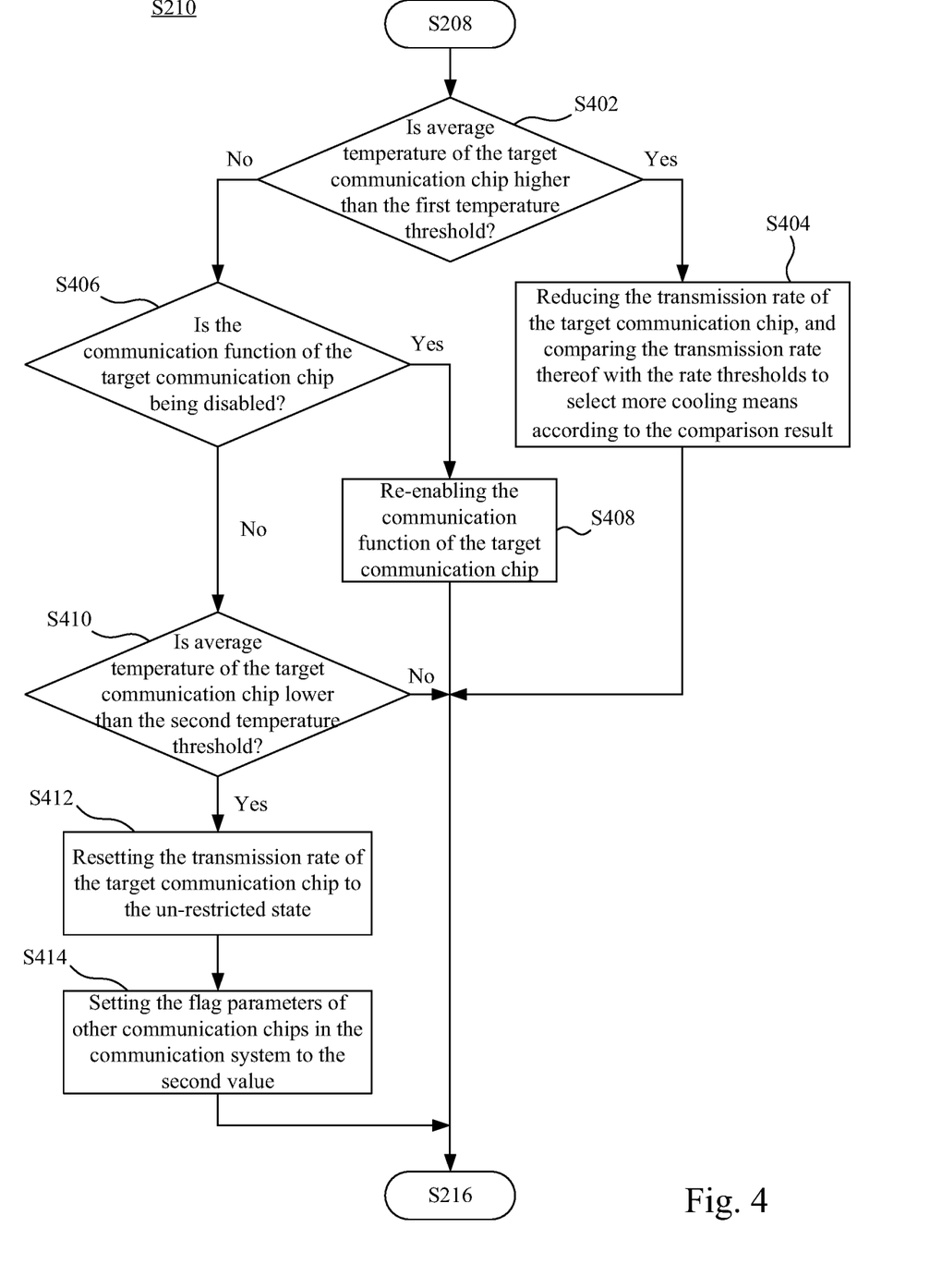
FIG. 4 is a flowchart for further illustrating operation S210 of FIG. 2.

FIG. 4 is a flowchart for further illustrating operation S210 of FIG. 2. In some embodiments, operation S210 includes operations S402-S414. In operation S402, the control circuit 110 determines whether the average temperature of the communication chip 120a is higher than the first temperature threshold. If the determination result shows YES, the control circuit 110 conducts operation S404 to reduce the transmission rate of the communication chip 120a, and to compare the transmission rate of the communication chip 120a with the plurality of rate thresholds. As a result, the communication chip 120a may select more cooling means for the communication chip 120a according to the comparison result, such as disabling signal emitting (Tx) and/or signal receiving (Rx) functions of the communication chip 120a, or reducing the transmission rates of other communication chips 120b and 120c in the communication system 100.

On the other hand, if the average temperature of the communication chip 120a is lower than or equal to the first temperature threshold, the control circuit 110 may conduct operations S406-S414 to increase the transmission rate of the communication chip 120a. In operation S406, the control circuit 110 determines whether the communication function of the communication chip 120a is disabled. If the determination result shows YES, the control circuit 110 recovers (or say re-enables) the communication function of the communication chip 120a in operation S408. In some embodiments, disabling the communication function stops the communication chip 120a from outputting or receiving RF signals.

If the communication function of the communication chip 120a is not disabled, the control circuit 110 conducts operation S410 to determine whether the average temperature of the communication chip 120a is lower than a second temperature threshold, in which the first temperature threshold is higher than the second temperature threshold. If the determination result shows YES, the control circuit 110 conducts operation S412 to reset the transmission rate of the communication chip 120a to the un-restricted state. After operation S412, the control circuit 110 conducts operation S414 to set the flag parameters of other communication chips 120b and 120c in the communication system 100 to the second value, in order to increase the transmission rate of the communication chips 120b and 120c. As a result, the when the control circuit 110 selects the communication chips 120b and 120c as targets of the temperature controlling method 200, the control circuit 110 increases the transmission rates of the communication chips 120b and 120c in operation S206 of FIG. 2.

On the other hand, if the average temperature if the communication chip 120a is higher than or equal to the second temperature threshold (i.e., between the first temperature threshold and the second temperature threshold), the control circuit 110 conducts operation S216 of FIG. 2. In addition, after operations S404, S408 and S414 are finished, the control circuit 110 also conducts operation S216.

Figure 5:
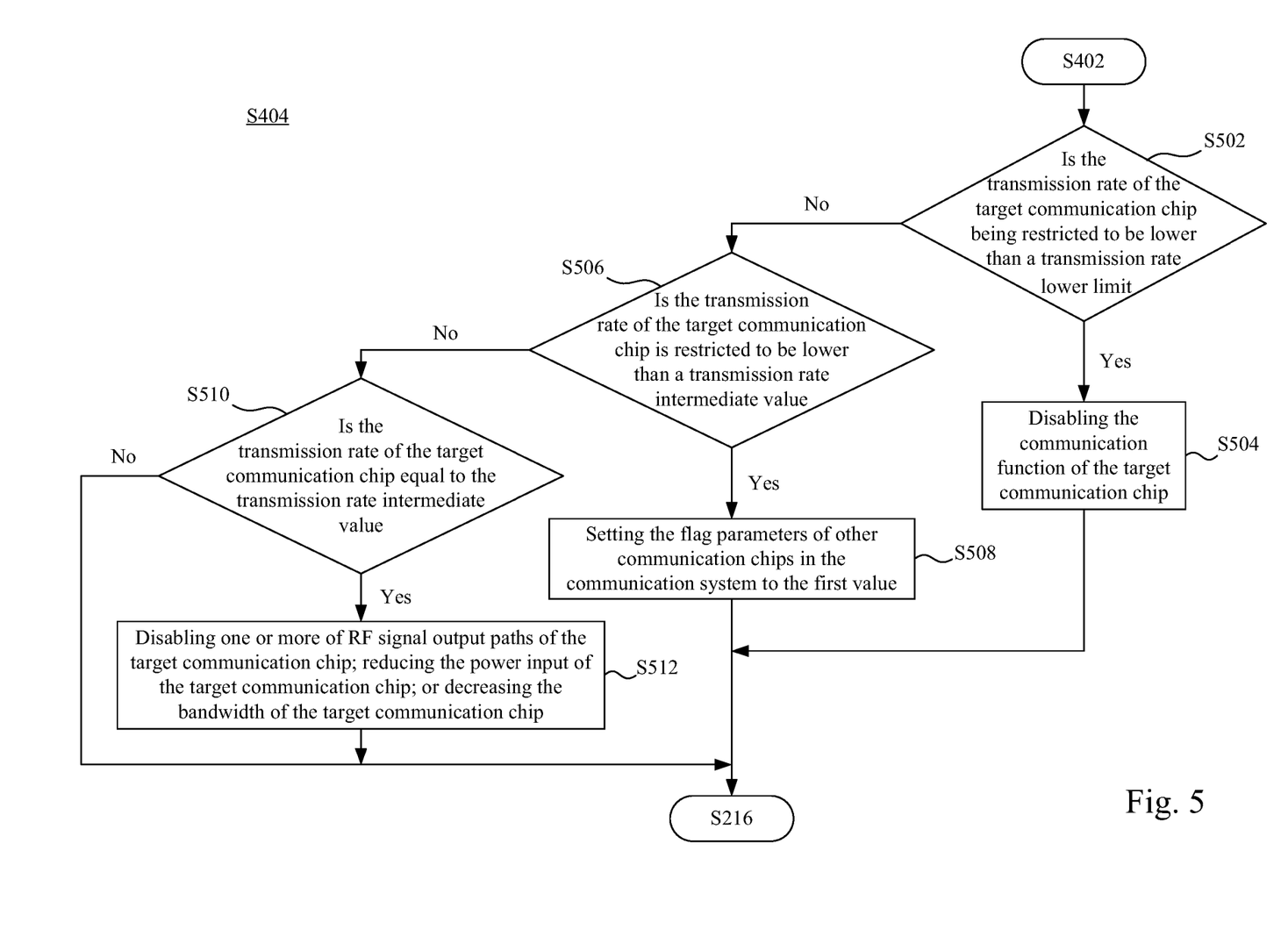
FIG. 5 is a flowchart for further illustrating operation S404 of FIG. 4.

FIG. 5 is a flowchart for further illustrating operation S404 of FIG. 4. In some embodiments, operation S404 includes operations S502-S512. In operation S502, the control circuit 110 determines whether the transmission rate of the communication chip 120a is restricted to be lower than a transmission rate lower limit. If the determination result shows YES, the control circuit 110 conducts the operation S504 to disable partial/all communication functions of the communication chip 120a, such as the signal emitting function and/or the signal receiving function. If the determination result shows NO, the control circuit 110 proceeds to operation S506.

In operation S506, the control circuit 110 determines whether the transmission rate of the communication chip 120a is restricted to lower than an transmission rate intermediate value, in which the transmission rate intermediate value is greater than the transmission rate lower limit. In some embodiments, when the control circuit 110 determines that the average temperature of the communication chip 120a is higher than the first temperature threshold in operation S212 (i.e., the "No" prong of operation S212), the control circuit 110 records the transmission rate of the communication chip 120a. The control circuit 110 further sets the transmission rate lower limit and the transmission rate intermediate value to 10% and 50% of the recorded transmission rate, but this disclosure is not limited thereto.

If the transmission rate of the communication chip 120a is lower than the transmission rate intermediate value (i.e., between the transmission rate intermediate value and the transmission rate lower limit), the control circuit 110 proceed to operation S508 to set the flag parameters of other communication chips 120b and 120c in the communication system 100 to the first value. As a result, when the control circuit 110 selects the communication chips 120b and 120c as the targets of the temperature controlling method 200, the control circuit 110 restricts the transmission rates of the communication chips 120b and 120c in operation S206 of FIG. 2, in order to support cooling of the communication chip 120a.

On the other hand, if the transmission rate of the communication chip 120a is higher than or equal to the transmission rate intermediate value, the control circuit 110 proceeds to operation S510 to determine whether the transmission rate of the communication chip 120a is equal to the transmission rate intermediate value. If the determination result shows YES, the control circuit 110 proceeds operation S512 to perform one or more of the following: disabling one or more of a plurality of RF signal output paths of the communication chip 120a; reducing the power input of the communication chip 120a; and decreasing the bandwidth of the communication chip 120a, but this disclosure is not limited thereto. If the determination result shows NO, the control circuit 110 then conducts operation S216 of FIG. 2.

In addition, when operations S504 and 508 are finished, the control circuit 110 may also proceed to operation S216 of FIG. 2.

The execution order of operations in the previous flowcharts is merely an example, rather than a restriction of practical implementations. In some embodiments, the operations S510 and S512 of FIG. 5 may be omitted, the control circuit 110 proceeds to operation S216 of FIG. 2 after determining that the transmission rate of the communication chip 120a is higher than or equal to the transmission rate intermediate value.

As can be appreciated from the above descriptions, the communication system 100 and the temperature controlling method 200 are capable of monitoring the temperatures of the communication chips 120a-120c in real-time, in order to gain a balance between performance and safety of a product.

In addition, in some embodiments, when a hardware cooling system (not shown) in the communication system 100 cannot prevent the temperature from rising, the temperature controlling method 200 provides additional cooling means and thus reducing the risk of overheating the communication system 100.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

Other embodiments of the present disclosure will be apparent to those skilled in the art from consideration of the specification and practice of the present disclosure disclosed herein. It is intended that the specification and examples be considered as exemplary only, with a true scope and spirit of the present disclosure being indicated by the following claims.

What is claimed is:

1. A temperature controlling method, suitable for a communication system comprising a plurality of communication chips, wherein the temperature controlling method comprises:
    calculating an average temperature of each communication chip;
    if a first flag parameter corresponding to a first chip of the plurality of communication chips is a predetermined value, adjusting a first transmission rate of the first chip according to the average temperature of the first chip; and
    if the first flag parameter corresponding to the first chip is different from the predetermined value, adjusting the first transmission rate according to the average temperature of a second chip of the plurality of communication chips.

2. The temperature controlling method of claim 1, wherein adjusting the first transmission rate according to the average temperature of the first chip comprises:
    if the first transmission rate is in an un-restricted state, and if the average temperature of the first chip is higher than a first temperature threshold, reducing the first transmission rate; and
    if the first transmission rate is reduced, adjusting the first transmission rate according to the average temperature of the first chip and a comparison result between the first transmission rate and a plurality of rate thresholds.

3. The temperature controlling method of claim 2, wherein adjusting the first transmission rate according to the average temperature of the first chip and the comparison result comprises:
    if the average temperature of the first chip is higher than the first temperature threshold, reducing the first transmission rate, and disabling a communication function of the first chip or reducing a second transmission rate of the second chip according to the comparison result; and
    if the average temperature of the first chip is equal to or lower than the first temperature threshold, increasing the first transmission rate.

4. The temperature controlling method of claim 3, wherein disabling the communication function of the first chip or reducing the second transmission rate of the second chip according to the comparison result comprises:
    if the first transmission rate is lower than a transmission rate lower limit of the plurality of rate thresholds, disabling the communication function of the first chip; and
    if the first transmission rate is higher than the transmission rate lower limit and lower than a transmission rate intermediate value of the plurality of rate thresholds, setting a second flag parameter corresponding to the second chip to a first value to reduce the second transmission rate.

5. The temperature controlling method of claim 4, wherein disabling the communication function of the first chip or reducing the second transmission rate of the second chip according to the comparison result further comprises:
    if the first transmission rate is substantially equal to the transmission rate intermediate value, switching off one or more of a plurality of radio frequency (RF) signal output paths of the first chip, reducing a power input of the first chip, or reducing a bandwidth of the first chip.

6. The temperature controlling method of claim 4, wherein adjusting the first transmission rate according to the average temperature of the first chip further comprises:
    recording the first transmission rate when the average temperature of the first chip is higher than the first temperature threshold; and
    setting the transmission rate lower limit and the transmission rate intermediate value to 10% and 50% of the recorded first transmission rate, respectively.

7. The temperature controlling method of claim 3, wherein increasing the first transmission rate comprises:
    if the average temperature of the first chip is lower than the first temperature threshold and the communication function of the first chip is disabled, recovering the communication function of the first chip; and
    if the average temperature of the first chip is lower than a second temperature threshold, setting the first transmission rate to the un-restricted state, and setting a second flag parameter corresponding to the second chip to a second value to increase the second transmission rate, wherein the first temperature threshold is higher than the second temperature threshold.

8. The temperature controlling method of claim 1, wherein adjusting the first transmission rate of the first chip according to the average temperature of the second chip comprises:
    if the first flag parameter is a first value indicating that the average temperature of the second chip is excessively high, reducing the first transmission rate;
    if the first flag parameter is a second value indicating that the average temperature of the second chip is normal, resetting the first transmission rate to an un-restricted state; and
    setting the first flag parameter to the predetermined value.

9. A communication system, comprising:
    a plurality of communication chips; and
    a control circuit, coupled to the plurality of communication chips, and is configured to:
        calculate an average temperature of each communication chip;

if a first flag parameter corresponding to a first chip of the plurality of communication chips is a predetermined value, adjust a first transmission rate of the first chip according to the average temperature of the first chip; and if the first flag parameter corresponding to the first chip is different from the predetermined value, adjust the first transmission rate according to the average temperature of a second chip of the plurality of communication chips.

10. The communication system of claim 9, wherein when the control circuit adjusts the first transmission rate according to the average temperature of the first chip, the control circuit is further configured to:

if the first transmission rate is in an un-restricted state, and if the average temperature of the first chip is higher than a first temperature threshold, reduce the first transmission rate; and if the first transmission rate is reduced, adjust the first transmission rate according to the average temperature of the first chip, and according to a comparison result between the first transmission rate and a plurality of rate thresholds.

11. The communication system of claim 10, wherein when the control circuit adjusts the first transmission rate according to the average temperature of the first chip and the comparison result, the control circuit is further configured to:

if the average temperature of the first chip is higher than the first temperature threshold, reduce the first transmission rate, and disable a communication function of the first chip or reduce a second transmission rate of the second chip according to the comparison result; and if the average temperature of the first chip is lower than or equal to the first temperature threshold, increase the first transmission rate.

12. The communication system of claim 11, wherein when the control circuit disables the communication function of the first chip or reduces the second transmission rate of the second chip according to the comparison result, the control circuit is further configured to:

if the first transmission rate is smaller than a transmission rate lower limit of the plurality of rate thresholds, disable the communication function of the first chip; and if the first transmission rate is higher than the transmission rate lower limit and lower than a transmission rate intermediate value of the plurality of rate thresholds, set a second flag parameter corresponding to the second chip to a first value to reduce the second transmission rate.

13. The communication system of claim 12, wherein when the control circuit disables the communication function of the first chip or reduces the second transmission rate of the second chip according to the comparison result, the control circuit is further configured to:

if the first transmission rate is substantially equal to the transmission rate intermediate value, disable one or more of a plurality of RF signal output paths of the first chip, reduce a power input of the first chip, or reduce a bandwidth of the first chip.

14. The communication system of claim 12, wherein when the control circuit adjusts the first transmission rate according to the average temperature of the first chip, the control circuit is further configured to:

record the first transmission rate when the average temperature of the first chip is higher than the first temperature threshold; and set the transmission rate lower limit and the transmission rate intermediate value to 10% and 50% of the recorded first transmission rate, respectively.

15. The communication system of claim 11, wherein when the control circuit increases the first transmission rate, the control circuit is further configured to:

if the average temperature of the first chip is lower than the first temperature threshold, and if the communication function of the first chip is disabled, recover the communication function of the first chip; and if the average temperature of the first chip is lower than a second temperature threshold, set the first transmission rate to the un-restricted state, and set a second flag parameter corresponding to the second chip to a second value to increase the second transmission rate, wherein the first temperature threshold is higher than the second temperature threshold.

16. The communication system of claim 9, wherein when the control circuit adjusts the first transmission rate according to the average temperature of the second chip, the control circuit is further configured to:

if the first flag parameter is a first value indicating that the average temperature of the second chip is excessively high, reduce the first transmission rate;

if the first flag parameter is a second value indicating that the average temperature of the second chip is normal, reset the first transmission rate to an un-restricted state; and set the first flag parameter to the predetermined value.

17. A control circuit, for being coupled with a plurality of communication chips to form a communication system, and being configured to:

calculate an average temperature of each communication chip;

if a first flag parameter corresponding to a first chip of the plurality of communication chips is a predetermined value, adjust a first transmission rate of the first chip according to the average temperature of the first chip; and if the first flag parameter of the first chip is different from the predetermined value, adjust the first transmission rate according to the average temperature of a second chip of the plurality of the communication chips.

18. The control circuit of claim 17, wherein when the control circuit adjusts the first transmission rate according to the average temperature of the first chip, the control circuit is further configured to:

if the first transmission rate is in a un-restricted state, and if the average temperature of the first chip is higher than a first temperature threshold, reduce the first transmission rate; and if the first transmission rate is reduced, adjust the first transmission rate according to the average temperature of the first chip, and according to a comparison result between the first transmission rate and a plurality of rate thresholds.

19. The control circuit of claim 18, wherein when the control circuit adjusts the first transmission rate according to the average temperature of the first chip and the comparison result, the control circuit is further configured to:

if the average temperature of the first chip is higher than the first temperature threshold, reduce the first transmission rate, and disable a transmission function of the first chip or reduce a second transmission rate of the second chip according to the comparison result; and if the average temperature of the first chip is lower than or equal to the first temperature threshold, increase the first transmission rate.

20. The control circuit of claim 17, wherein when the control circuit adjusts the first transmission rate according to the average temperature of the second chip, the control circuit is further configured to:

if the first flag parameter is a first value indicating that the average temperature of the second chip is excessively high, reduce the first transmission rate;

if the first flag parameter is a second value indicating that the average temperature of the second chip is normal, reset the first transmission rate to an un-restricted state; and set the first flag parameter to the predetermined value.

* * * * *